United States Patent [19]
Suzuki

[11] Patent Number: 5,381,003
[45] Date of Patent: Jan. 10, 1995

[54] AUGER ELECTRON SPECTROSCOPY

[75] Inventor: Ryoichi Suzuki, Tsukuba, Japan

[73] Assignee: Agency of Industrial Science & Technology, Tokyo, Japan

[21] Appl. No.: 27,759

[22] Filed: Mar. 8, 1993

[30] Foreign Application Priority Data

Jun. 19, 1992 [JP] Japan .................. 4-186328

[51] Int. Cl.$^6$ ............................. H01J 37/26
[52] U.S. Cl. ................... 250/305; 250/306; 250/307; 250/309; 250/287
[58] Field of Search ............ 250/305, 306, 309, 287, 250/307, 304

[56] References Cited

U.S. PATENT DOCUMENTS

| | | | |
|---|---|---|---|
| 4,486,659 | 12/1984 | Turner | 250/306 |
| 4,740,694 | 4/1988 | Nishimura et al. | 250/306 |
| 5,159,195 | 10/1992 | Van House | 250/306 |

OTHER PUBLICATIONS

Physical Review B, vol. 43, No. 13, May 1st, 1991, "Positron—induced Auger—electron Study Of The Ge(100) Surface: Positron Thermal Desorption and Surface Condition", E. Soininen et al., pp. 10051–10061.
Alex Weiss et al, "Positron annihilation induced Auger electron spectroscopy and its implementation at accelerator based low energy positron factories" Nuclear Instruments and Methods in Physics Research B56/57, 1991, pp. 591–594.
R. Mayer et al, "Temperature dependence of low-energy positron—induced Auger—electron emission: Evidence for high surface sensitivity", Physical Review B, vol. 42, No 4, Aug. 1990, pp. 1881–1884.
A. Weiss et al, "Auger—Electron Emission Resulting from the Annihilation of Core Electrons with Low—Energy Positrons", Physical Review Letters, vol. 61, No. 19, Nov. 7th, 1988, pp. 2245–2248.

Primary Examiner—Paul M. Dzierzynski
Assistant Examiner—Kiet T. Nguyen
Attorney, Agent, or Firm—Spencer, Frank & Schneider

[57] ABSTRACT

A pulsed positron beam capable of annihilating with electrons in an element to induce an Auger emission process is applied in a sample, the flight time t of a number of electrons including an Auger electron emitted from a surface of the sample fly from the sample over a predetermined distance d is measured, the velocity distribution of the emitted electrons is determined from the distance d and the time t, the energy distribution of the emitted electron is determined from the velocity distribution, and the peak of the emitted Auger electron is measured from the obtained energy distribution to analyze the bonding condition of elements of the sample surface with a high precision.

2 Claims, 3 Drawing Sheets

AUGER ELECTRON SPECTROSCOPY

BACKGROUND OF THE INVENTION

1. Field of the Invention

The present invention relates to Auger electron spectroscopy and an apparatus thereof, which applies an energetic quanta to a substance to achieve elemental analysis of the surface and a very thin surface layer of the substance and analysis of the surface condition from electrons emitted by an Auger process.

2. Description of the Prior Art

As is well known, when an atom of an element having more than one electron orbit is applied with an external energy exceeding a predetermined threshold value, some of the electrons in the stable orbit are ejected out from the inside orbit. There occurs a phenomenon in which, to supply electron holes generated by such ejection of electrons, an electron in the outer orbit moves to the hole, and other electrons in the outer orbit are emitted. Such an emitted electron is called an Auger electron, which has a specific energy, and its energy differs for different elements. Therefore, the energy of the emitted Auger electron can be measured to analyze the element emitting the electron.

As described above, the energy of an electron emitted from the surface of a substance by the Auger process has a value which is specific to each element, and varies slightly with the bonding condition of the element. Therefore, the energy and intensity of an Auger electron emitted from a substance can be measured to achieve an elemental an analysis of the surface and analysis of surface condition of the substance.

As previously described, to effect the Auger process, it is necessary to make vacant the energy level of the inner shell of electron orbits of the element. To achieve this, the element has heretofore had applied thereto an energy exceeding a predetermined threshold value. High energy electrons, high energy ions, and high-energy photons have such an energy. An inner shell electron is excited by such an energetic quantum to generate a hole in the orbit. Recently, on the other hand, it has been proposed to use positrons, which are antiparticles of electrons, as a method for creating an electron hole in the inner electron orbit of a sample element. The positron, when applied to an element, collides with an inner shell electron of the element and is annihilated with the electron to create a hole in the inner orbit.

A positron-induced Auger electron spectroscopy and apparatus have the following advantages over Auger electron spectroscopy and apparatus using other energetic quanta.

(1) Since the energy of an incident positron can be lower than that of the Auger electron, in an energy spectrum, background noise due to electrons other than the Auger electron at a peak position of the Auger electron can be reduced.

(2) Since the energy of the incident positron can be reduced, the implantation depth of the positron can be reduced and, furthermore, a positron reaching a position slightly inside the surface has a high probability of reverting back to the surface where it annihilated with an electron of the outermost atom, thereby providing a very high surface sensitivity.

(3) Since this technique is low in background noise and high in surface sensitivity, the amount of the incident beam can be reduced, thereby reducing damage to the sample surface.

Heretofore, as a positron-annihilation-induced Auger electron spectroscopic apparatus, one which is shown in FIG. 1 has been known (e.g. Physical Review B, vol. 42, No. 4, p.1881).

Hereinafter, $e^+$ is referred to a positron or positron beam, and $e^-$ is referred to an Auger electron or Auger electron beam.

In FIG. 1, symbol 11 indicates a positron generator for generating a positron beam $e^+$, symbol 2 indicates a sample, symbol 31 indicates a position-sensitive electron detector, symbol 5 indicates a deflection electrode for beam orbit separation, symbol 6 indicates a magnet such as a permanent magnet or an electromagnet, and symbol 7 indicates a deflection electrode for energy analysis. The entire apparatus is contained in a vacuum vessel.

In these apparatuses, a positron beam $e^+$ is guided by a magnetic field B to the sample 2, where the positron $e^+$ collides with and annihilates an inner shell electron in the sample 2 to create a hole in the inner shell electron orbit. The emission direction of Auger electron $e^+$ emitted by transition of an outer shell electron into the hole is arranged by the magnet 6, separated from the orbit of positron $e^+$ by the deflection electrode 7, and the energy of the Auger electron $e^-$ is analyzed by an energy analyzer comprising the deflection electrode 7 and the position-sensitive electron detector 31.

In the prior art apparatus shown in FIG. 1, since the energy analysis uses the deflection electrode 7 and the position-sensitive electron detector 31, and the positron beam $e^+$ incident to the sample 2 has a spatial spread, it has been difficult to analyze the energy with a high resolution. Therefore, there have been problems in that elements having energy distributions which are close to each other cannot be distinguished, and minute changes in peak positions cannot be measured.

With a view toward eliminating the above-described prior art problems, it is a primary object of the present invention to provide a position-induced Auger electron spectroscopy and an apparatus therefor which can conduct Auger electron spectroscopic measurement using a positron beam, and which features low background noise and high surface sensitivity with high resolution.

SUMMARY OF THE INVENTION

In accordance with the present invention, there is provided a position-induced Auger electron spectroscopy comprising the steps of applying a pulsed positron beam to annihilate with electrons in an element to induce an Auger emission process in a sample, measuring a flight time t of a number of electrons including an Auger electron emitted from the sample where in the electrons fly from a surface of the sample over a predetermined distance d, determining a velocity distribution of the emitted electrons from the distance d and the time t, determining an energy distribution of the emitted electrons, and measuring a peak of the emitted Auger electron from the obtained energy distribution to analyze a bonding condition of elements of the sample surface with high precision.

There is also provided according to the present invention position-induced Auger electron spectroscopic apparatus comprising at least a pulsed positron beam generator for generating a pulsed positron beam to induce an Auger process in an element on a surface of a sample by annihilation with an electron in the element, an electron detector for detecting a number of electrons including an Auger electron emitted from the sample by incidence of the pulsed positron beam to the sample, and a flight time analyzer for measuring a flight time t of the electrons detected by the electron detector wherein the electron detector is placed a distance d apart from the surface of the sample and determining an energy distribution of the emitted electrons including the Auger electron from the measured values.

In the present invention, it is a necessary condition that the flight time t of the emitted Auger electron is greater than any of a pulse time width δtp, a lifetime τ from incidence of the positron beam to the sample to annihilation, and a time resolution δtd of the electron detector.

The above and other objects, effects, features and advantages of the present invention will become more apparent from the following description of embodiments thereof taken in conjunction with the accompanying drawings.

DESCRIPTION OF THE PREFERRED EMBODIMENTS

Embodiment 1

The present invention will now be described even Further in detail with reference to the appended drawings.

Figure 1:
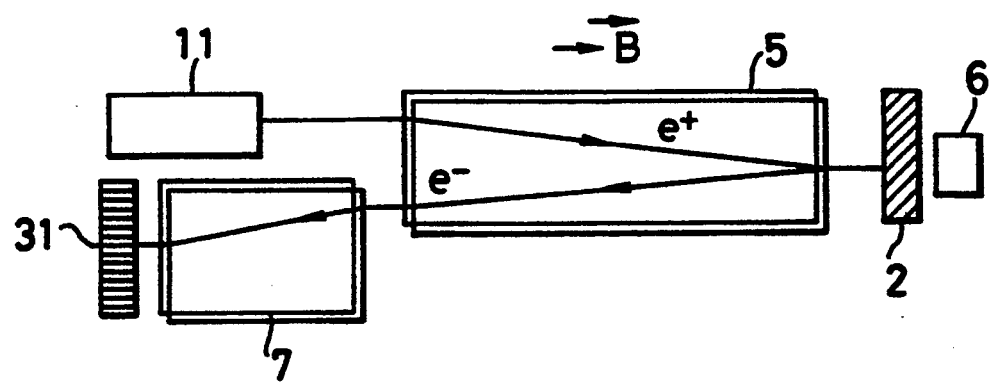
FIG. 1 is a schematic illustration showing an example of a prior art positron-induced Auger electron spectroscopic apparatus.
Figure 2:
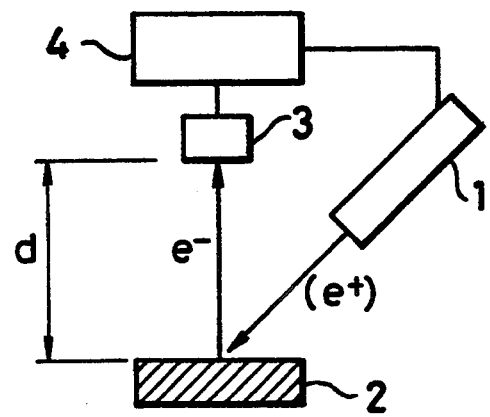
FIG. 2 is a schematic illustration showing a first embodiment of the Auger electron spectroscopic apparatus according to the present invention.

FIG. 2 is a schematic illustration showing a first embodiment of the Auger electron spectroscopic apparatus according to the present invention. In the Figure, components similar to those in FIG. 1 are indicated by similar symbols. Numeral 1 indicates a pulsed positron beam generator which generates a pulsed positron beam with a repetition period of more than a few hundred nanoseconds. Hereinafter, the pulsed positron beam is referred to as (e+) . Numeral 3 indicates an electron detector, and numeral 4 indicates a flight time analyzer for the Auger electron e−. The flight time analyzer of the present embodiment has the simplest structure.

In the apparatus of the present embodiment, the pulsed positron beam generator 1 applies the pulsed positron beam (e+) to a sample 2, the Auger electron e− emitted from the sample 2 is detected by the electron detector 3 placed a distance d apart from the sample 2, and the flight time t is measured by the flight time analyzer 4 to determine the energy distribution of the emitted Auger electron e.

Specifically, in the present apparatus, when the pulsed positron beam (e+) is incident an the sample 2, it annihilates with electrons in the sample 2 for a short time of several hundred picoseconds. Then an Auger electron e− emitted from the surface of he sample 2 by the Auger process induced by supplying an electron hole in the inner shell electron orbit generated at this moment is detected at a distance d to determine the flight time t. In this case, as is well known, an electron emitted from the sample 2 also includes a secondary electron emitted by a kinetic process. The speed v of the emitted electron is determined from the distance d and the flight time t (v=d/t), and the energy of the electron including the Auger electron e− is determined from the speed v. The energy measurement is carried out for a plurality of electrons to determine the energy distribution of the emitted electrons including the Auger electron e−. Elements on the surface of the sample can be analyzed from the Auger peak energy value and its intensity of energy distribution. Energy resolution in this case is determined by the lifetime of the pulsed positron beam (e+) from incidence of the positron to the sample to annihilation, the pulse width δtp, and the resolution δtd of the electron detector 3, and these factors make the flight time t of the Auger electron e− uncertain, and lower the resolution.

The energy of the emitted electron in this case is determined by the flight time t and distance d. The distance d, that is, the distance between the sample 2 and the electron detector 3 can be measured with a relatively high accuracy. On the other hand, the other flight time t is the difference between the time at which the Auger electron e− is emitted from the sample 2 and the time at which the Auger electron e− emitted from the sample 2 reaches the electron detector 3, however, since the present apparatus measures the difference between the time at which the positron e+ is incident to the sample 2 and the time at which the electron detector 3 transmits a detection signal. Here, the time until the positron is incident on the sample 2 fluctuates within the pulse time width (a few hundred picoseconds to several nanoseconds) of the pulsed positron beam (e+), whereas the time from incidence of the positron e+ an the sample 2 to the emission of the Auger electron fluctuates with the lifetime (several hundred picoseconds) of positron e+. Furthermore, signal measurement of the electron detector 3 also involves a finite resolution (less than several hundred picoseconds). Therefore, measurement errors of flight time and time resolution of energy depend upon these time fluctuations and the time required for resolution of the detector. However, when the distance d is set Longer to obtain a longer flight time of more than several tens of nanoseconds, relatively, (flight time t)>>(lifetime τ to annihilation of positron), (flight time t)>>(pulse width δtp of the positron beam), (flight time t)>>(time resolution δtd of the electron detector) can be obtained, and the resolution of the energy distribution measurement of the Auger electron e− can be improved. This facilitates separation of peaks having close energy values. Consequently elemental analysis of the surface and analysis of bonding condition of an element can be made with a higher accuracy than with other apparatus.

Embodiment 2

Figure 3:
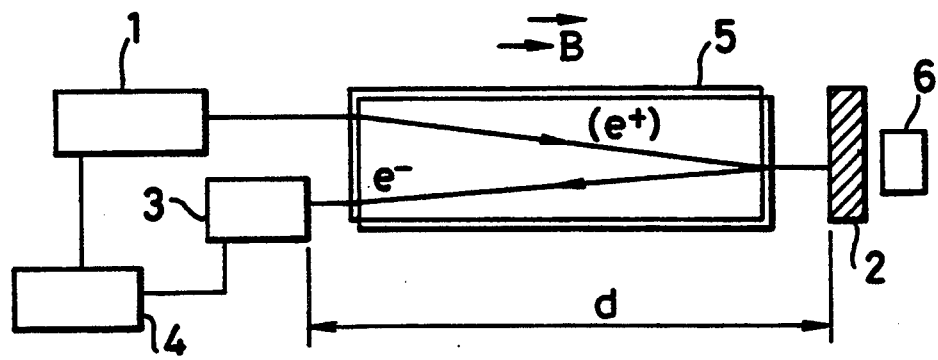
FIG. 3 is a schematic illustration showing a second embodiment of the Auger electron spectroscopic apparatus according to the present invention.

FIG. 3 is a schematic illustration of a second embodiment of the apparatus according to the present invention. In this apparatus, as in the prior art apparatus shown in FIG. 1, the pulsed positron beam (e+) is guided by a magnetic field B, and orbits of the pulsed positron beam (e+) incident to the sample 2 and the Auger electron e− emitted from the sample 2 are separated by the deflection electrode 5. The emitted Auger electron e− is detected by the electron detector 3 at a distance d from the sample 2, the flight time t is measured by the flight time analyzer 4 to determine the energy distribution of the Auger electron $e^-$. In this second embodiment, since the spatial spread of the pulsed positron beam ($e^+$) and the Auger electron is suppressed by the magnetic field B, a measurement with a higher resolution can be made than with the apparatus of the first embodiment without degradation of detection efficiency even when the flight time t is set longer.

Figure 4:
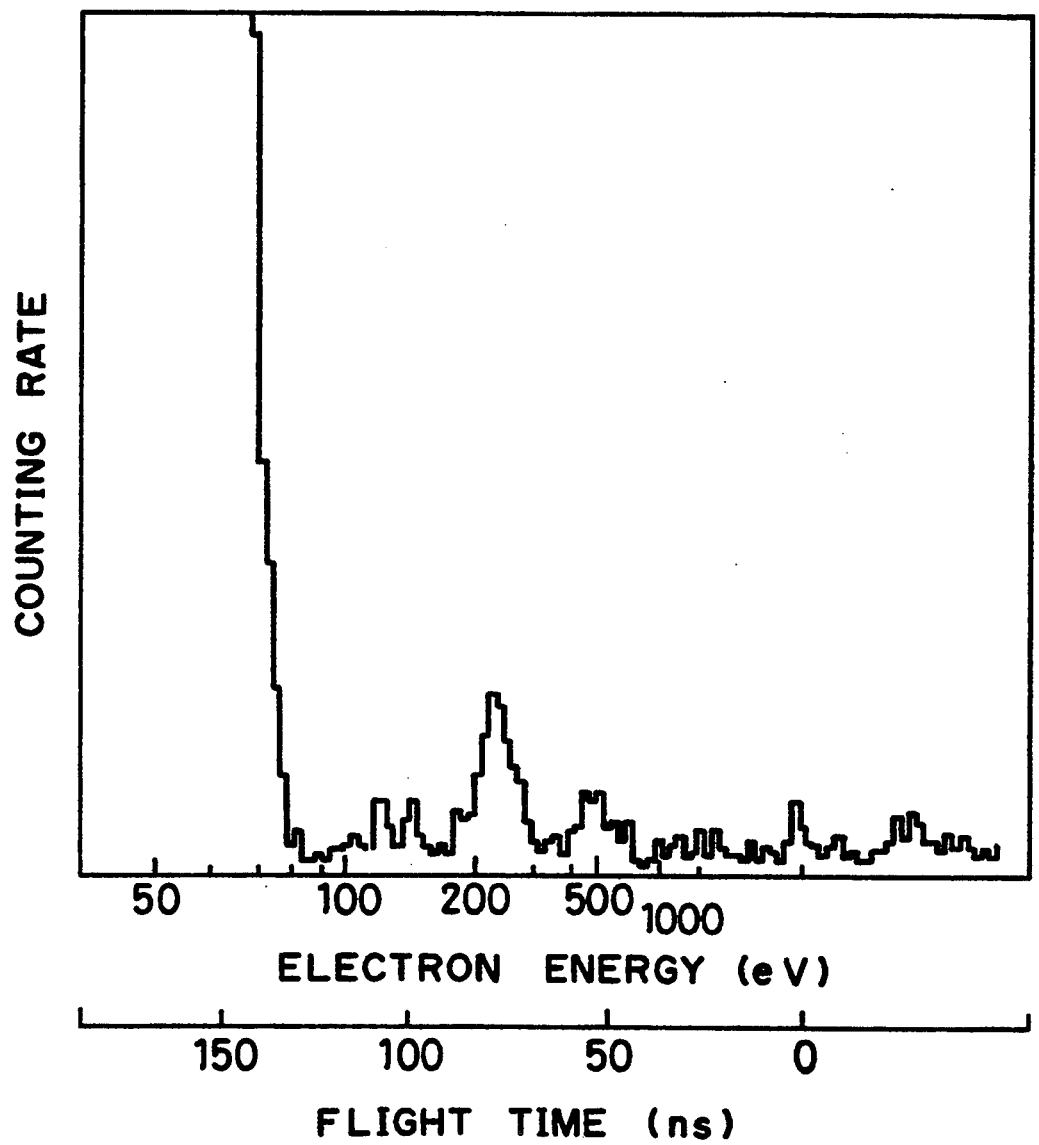
FIG. 4 is a graph illustrating the flight time of an Auger electron in the apparatus of the second embodiment of the present invention.

With this second embodiment, a measurement was carried out with a distance d of 0.7 m, using graphite as a sample 2, using a 70 eV positron beam with a pulse width of about 2.0 nanoseconds as a pulsed positron beam ($e^+$), and with a magnetic field B having an intensity of 0.007 T. FIG. 4 is a graph showing the flight time (energy) distribution of the emitted electron when the above pulsed positron beam ($e^+$) is applied to the surface of a graphite sample. Of the two divisions on the axis of abscissas, the lower division indicates a flight time t, and the upper division indicates the energy of the emitted electron corresponding to the flight time t. The axis of ordinates indicates the counting rate of an electron.

As can be seen from the graph, a distinct peak is noted in the vicinity of 200–300 eV, in addition the distribution of secondary electron below 70 eV. This peak is one which corresponds to the Auger electron $e^-$ of carbon. The measured peak can be clearly observed to be different from the energy distribution of a conventional Auger electron spectroscopic apparatus using an electron beam in which the peak of the Auger electron $e^-$ and a background due to secondary electrons other than the Auger electron $e^-$ overlap.

With this apparatus of the second embodiment, an even further accurate measurement is possible than the result shown in FIG. 4, if the flight time t is set longer, and the pulse time width of the positron $e^+$ is set shorter.

Comparative Example

Figure 5:
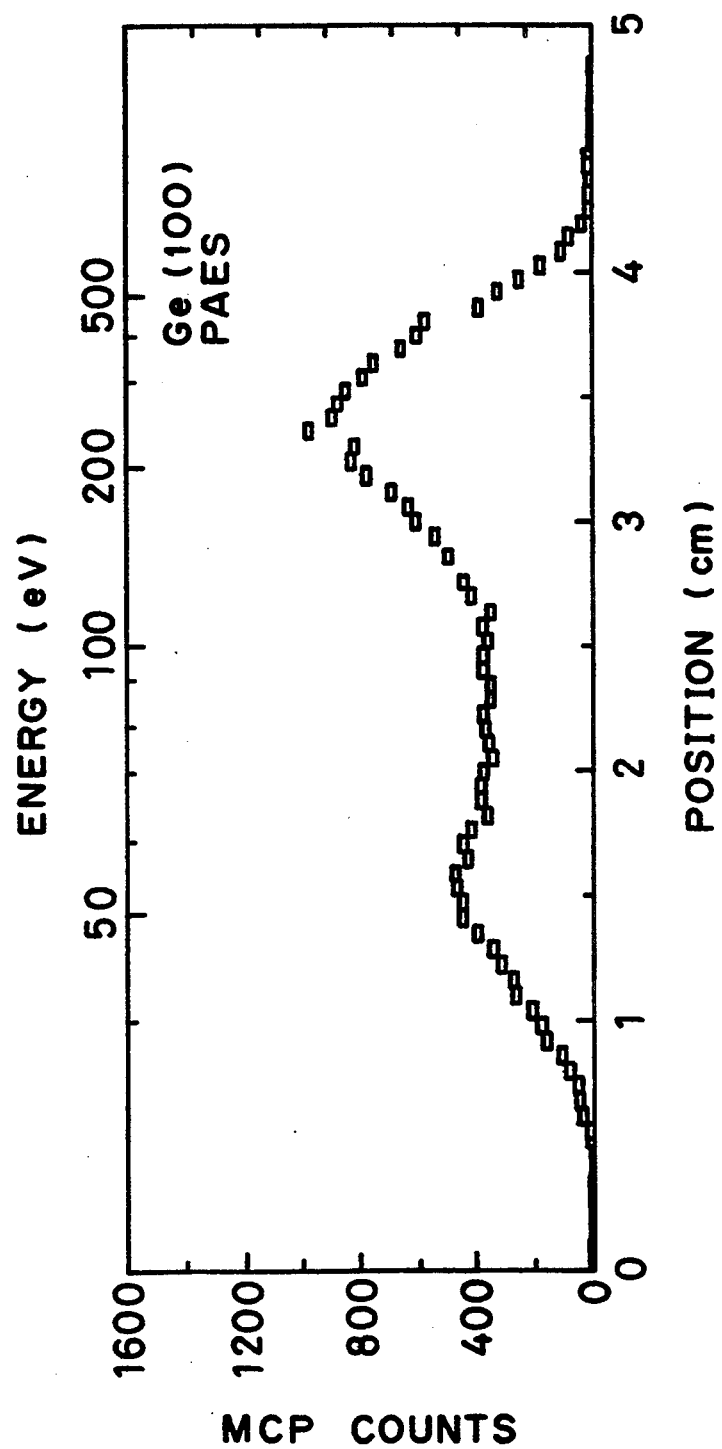
FIG. 5 is a graph illustrating the result of a measurement made with the prior art positron-induced Auger electron spectroscopic apparatus shown in FIG. 1.

The present invention realizes high resolution, and high accuracy over the prior art method and apparatus (FIG. 1) using a positron. Therefore, a measurement was conducted using the prior art apparatus shown in FIG. 1 and germanium to which carbon is attached as a sample 2, with a 35 eV positron beam and a magnetic field B intensity of 0.0035 T. The resulting Auger electron spectrum is shown in FIG. 5 (Physical Review B vol. 43 No. 13 p.10051). In this spectrum, the peak between 200 eV and 300 eV is the Auger peak of carbon. When this Figure is compared with FIG. 4 showing the measurement result of the embodiment of the apparatus according to the present invention, it is obvious that the energy distribution measured by the apparatus of the present invention shows a clearer peak corresponding to the Auger electron $e^-$ of carbon.

The present invention has been described in detail with respect to preferred embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. A positron-induced Auger electron spectroscopy comprising:

applying a pulsed positron beam to annihilate with electrons in an element to induce an Auger emission process in a sample;

measuring a flight time t of a number of electrons including an Auger electron emitted from the sample, wherein the electrons including the Auger electron fly from a surface of the sample over a predetermined distance d, the flight time t of the emitted Auger electron being sufficiently greater than either of a pulse time width $\delta t_p$ of the pulsed positron beam and a lifetime $\tau$ from incidence of the pulsed positron beam to the sample to annihilation with the electrons;

determining a velocity distribution of the emitted electrons including the Auger electron from the distance d and the flight time t;

determining an energy distribution of the emitted electrons including the Auger electron; and measuring a peak of the emitted Auger electron from the obtained energy distribution to analyze a bonding condition of elements of the sample surface.

2. A positron-induced Auger electron spectroscopic apparatus comprising:

a pulsed positron beam generator for generating a pulsed positron beam to induce an Auger emission process in an element on a surface of a sample by annihilation with electrons in the element;

an electron detector for detecting a number of electrons including an Auger electron emitted from the sample by incidence of the pulsed positron beam to the sample; and a flight time analyzer for measuring a flight time t of the electrons including the Auger electron detected by said electron detector, wherein the electron detector is placed a distance d apart from the surface of the sample and determining an energy distribution of the emitted electrons including the Auger electron from the measured values, the flight time of the emitted Auger electron being sufficiently greater than any of a pulse time width $\delta t_p$ of the pulsed positron beam and a lifetime $\tau$ from collision of the pulsed positron beam to the sample to annihilation with the electrons.

* * * * *